(12) United States Patent
O'Keefe et al.

(10) Patent No.: US 6,846,698 B2
(45) Date of Patent: Jan. 25, 2005

(54) SEMICONDUCTOR WAFER HANDLING METHOD

(75) Inventors: Matthew Francis O'Keefe, Aycliffe Village (GB); John Melvyn Cullen, Darlington (GB)

(73) Assignee: Filtronic Compound Semiconductor Ltd., Durham (GB)

( * ) Notice: Subject to any disclaimer, the term of this patent is extended or adjusted under 35 U.S.C. 154(b) by 113 days.

(21) Appl. No.: 10/126,273

(22) Filed: Apr. 19, 2002

(65) Prior Publication Data

US 2002/0177257 A1 Nov. 28, 2002

(30) Foreign Application Priority Data

Apr. 25, 2001 (GB) .............................................. 0110088

(51) Int. Cl.⁷ .............................................. H01L 21/44
(52) U.S. Cl. ........................ 438/106; 438/113; 438/464
(58) Field of Search ................................. 438/110, 106, 438/107, 108, 118, 455, 458, 459, 460, 464, 113

(56) References Cited

U.S. PATENT DOCUMENTS

| | | | | |
|---|---|---|---|---|
| 6,555,443 B1 | * | 4/2003 | Artmann et al. | ............ 438/458 |
| 6,667,192 B1 | * | 12/2003 | Patrice et al. | ............... 438/123 |
| 2001/0018229 A1 | * | 8/2001 | Kato et al. | ................... 438/106 |

* cited by examiner

*Primary Examiner*—Tuan H. Nguyen
(74) *Attorney, Agent, or Firm*—Beyer Weaver & Thomas LLP

(57) ABSTRACT

A method of handling a semiconductor wafer from which a plurality of semiconductor devices are to be fabricated during a semiconductor device fabrication process. The method includes the steps of attaching a flexible connected layer to a semiconductor wafer layer mounted on a carrier substrate and separating the wafer layer from the carrier substrate while supported by the flexible connected layer.

13 Claims, 3 Drawing Sheets

Figure 1:
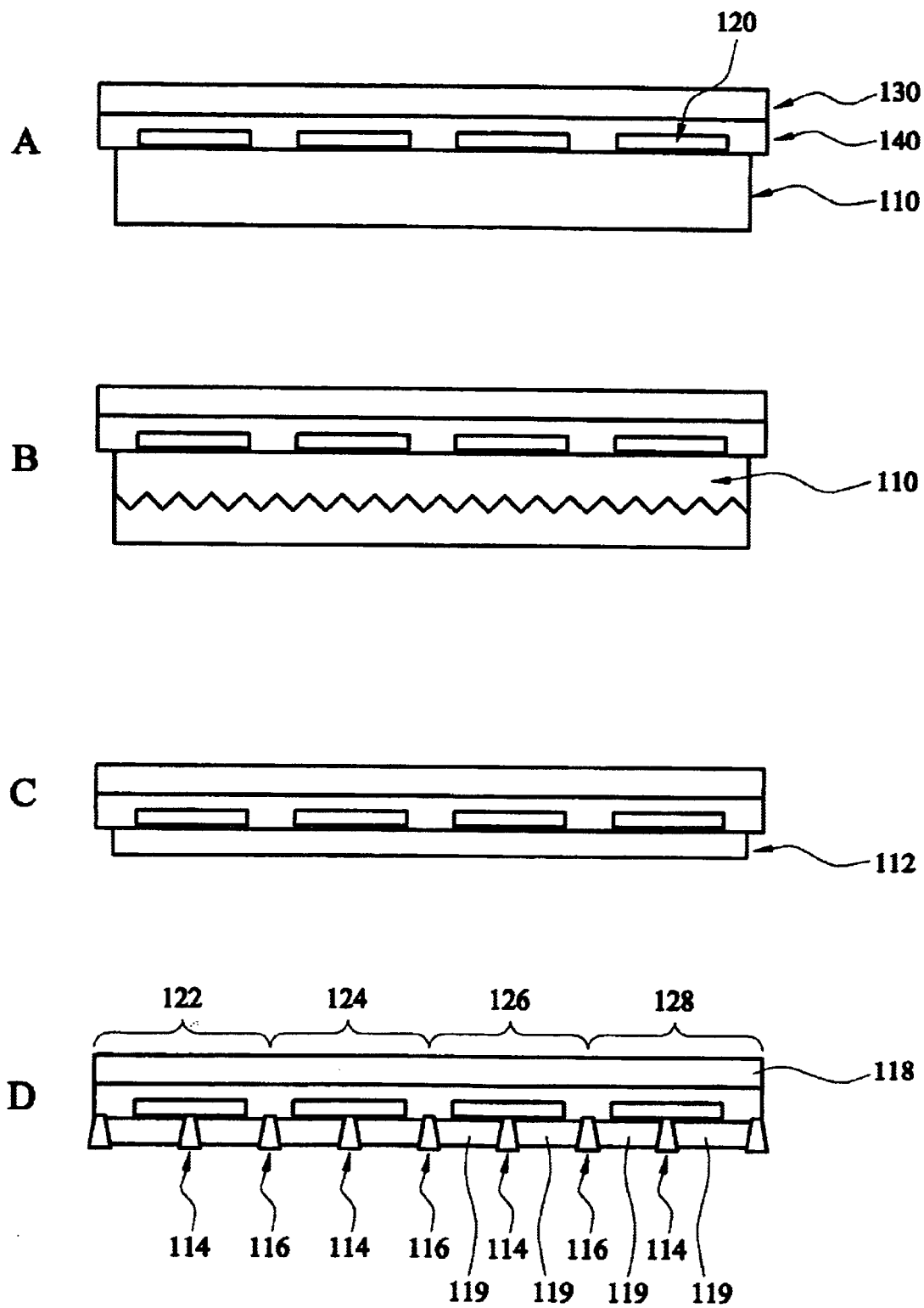
Figure 1:
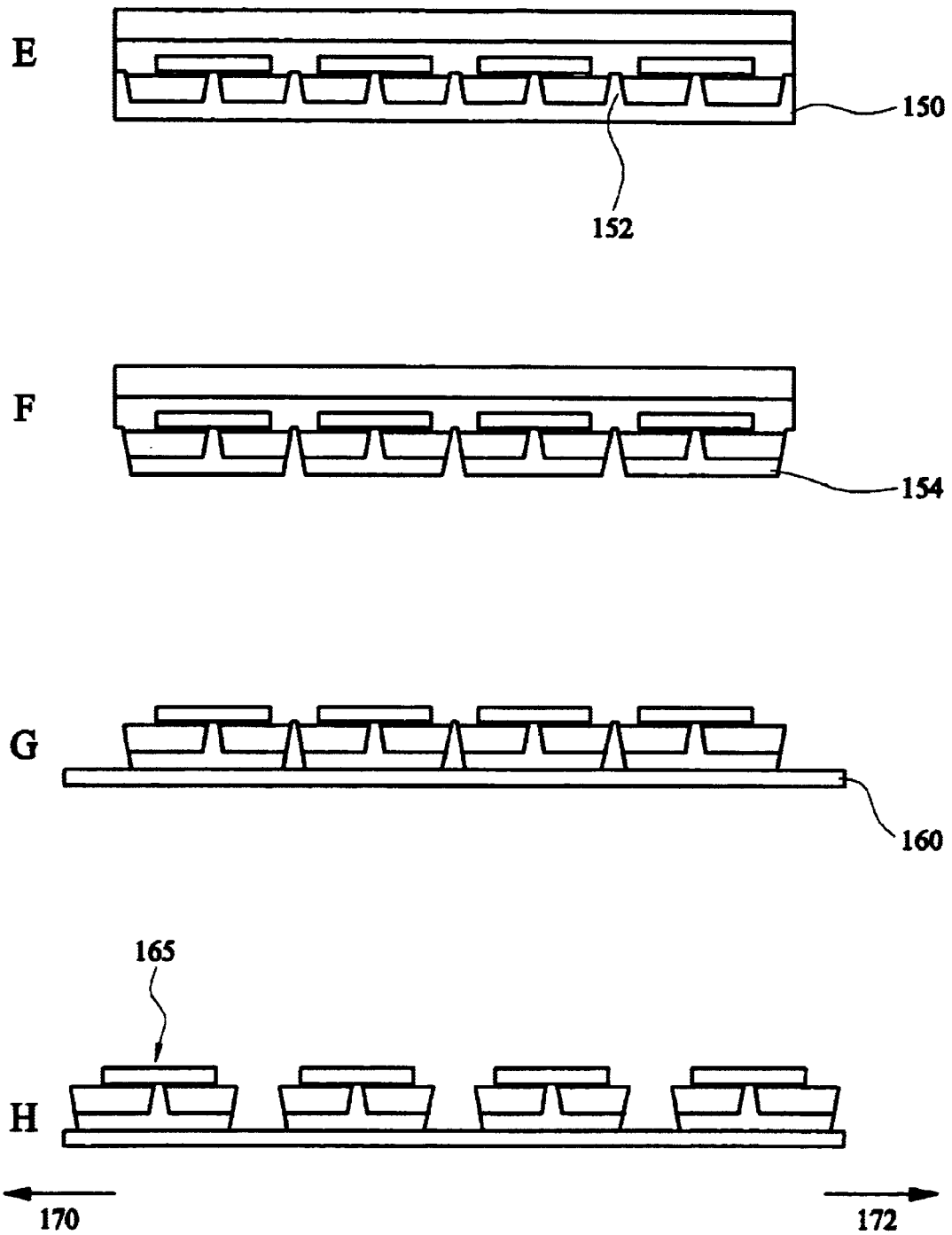

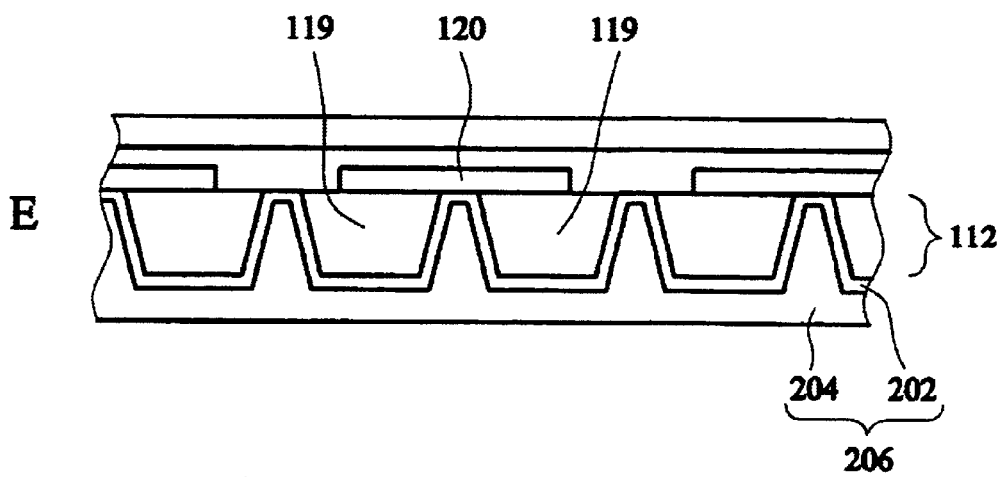
FIG. 2
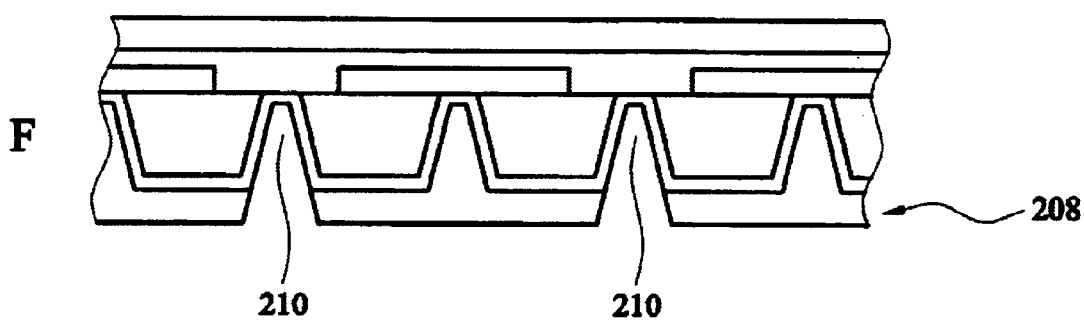
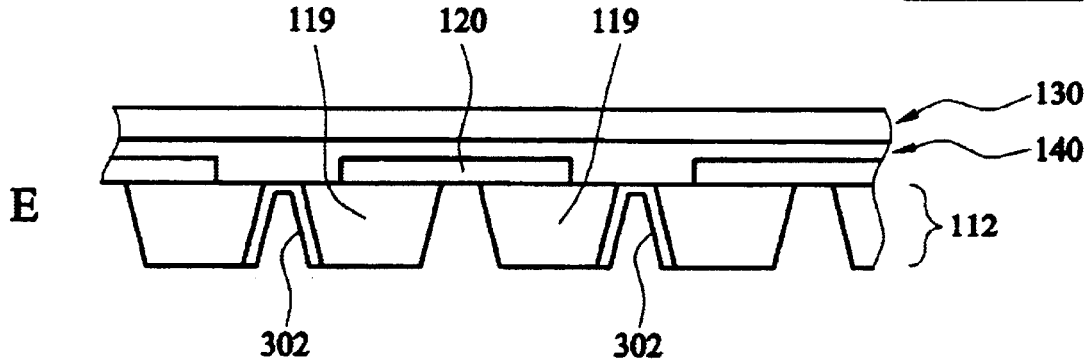
FIG. 3
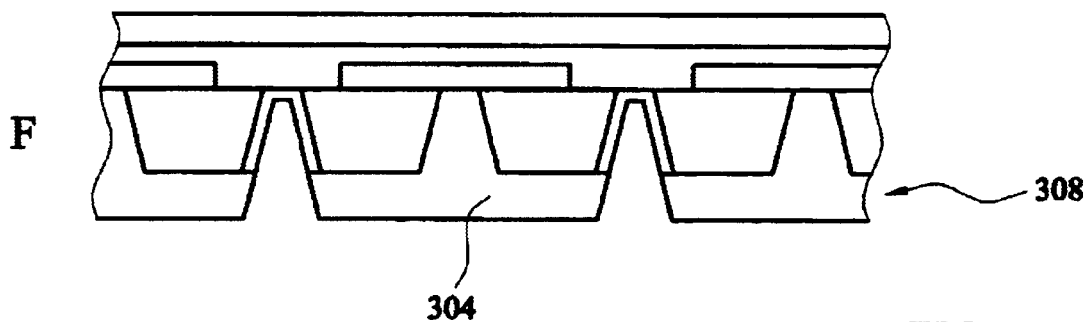

SEMICONDUCTOR WAFER HANDLING METHOD

The present invention relates to a method of handling semiconductor wafers and in particular to a method of handling thin semiconductor wafers during the fabrication of semiconductor devices.

Semiconductor devices having a thin semiconductor layer can be required for power handling applications in order to obviate difficulties resulting from the thermal characteristics of the semiconductor material.

For example, laterally diffused metal oxide semiconductor (LDMOS) devices use silicon as the semiconductor material. GaAs is another commonly used semiconductor material for semiconductor devices, but GaAs has four times the thermal resistance of silicon. Therefore, in order to prevent thermal degradation of a device during normal operation, various techniques can be used to remove heat from the device. One such technique is to reduce the thickness of the semiconductor material in devices, by using thin semiconductor material layers, so that the devices are less thick than normal device thicknesses which are typically at least 100 $\mu$m.

However, some semiconductor materials are extremely brittle and the handling of large area wafers of thin material is very difficult, owing to weight based bending moments.

One method of addressing this handling difficulty has been to use manual labour intensive techniques. Many of these techniques start with wafer diameters of three or four inches and, after a device topology has been defined and prior to thinning the thickness of the semiconductor layer, the wafer size is reduced; eg the wafer is quartered.

The most notable disadvantage of such techniques is that they are manual labour intensive. Further, these techniques require acquired skill rather than volume manufacturing techniques. Furthermore, the techniques tend to be low yield and the devices are consequently expensive. As these techniques reduce the size of the wafer, they cannot use volume manufacturing techniques that are based on the full wafer size.

There is therefore a need for a method allowing semiconductor devices to be fabricated in volume from full size thin semiconductor wafers.

According to a first aspect of the present invention, there is provided a method of handling a semiconductor wafer from which a plurality of semiconductor devices are to be fabricated during a semiconductor device fabrication process, comprising the steps of attaching a flexible connected layer to a semiconductor wafer layer mounted on a carrier substrate and separating the wafer layer from the carrier substrate while supported by the flexible connected layer.

The flexible connected layer supports the semiconductor wafer to ensure that it is mechanically stable while allowing a full size wafer to be used so that processing can be conducted in a volume fabrication facility. Supporting the thin wafer on the flexible connected layer reduces breaking and the introduction of device degrading micro-fractures in the semiconductor layer. The method allows volume manufacturing techniques as the wafer is full size and therefore obviates manual labour and increases the yield thereby reducing the semiconductor device unit cost.

The flexible connected layer is sufficiently rigid to ensure the mechanical stability of the thin wafer; ie to prevent it snapping. The flexible connected layer is continuous so as to retain the position of the plurality of devices during the fabrication process.

The flexible connected layer can be an electrically conducting material. The layer can be a film. The layer can be a metal. The layer can have a thermal expansivity substantially matching the thermal expansivity of the semiconductor material. The layer can be a material having a high thermal conductivity. The layer can be copper or silver. Preferably the layer is gold. More preferably the layer is a tungsten/titanium alloy. The layer material should have a ductility allowing the individual devices eventually to be mechanically separated with ease. Preferably the layer has a thickness of substantially 1 to 50 $\mu$m, and more preferably substantially 10 to 20 $\mu$m. Preferably the layer is attached to the wafer layer by deposition.

The method can include the step of forming a trench through the wafer layer and between adjacent devices. Trenches are formed between the adjacent devices that will result from the semiconductor layer by removing the semiconductor material between adjacent devices. This is done while the thin wafer is still supported by the carrier substrate which provides mechanical stability to the thin wafer layer. Semiconductor material is removed from the semiconductor wafer layer between all of the adjacent device parts of the semiconductor layer. Sufficient material is removed such that each of the device parts is isolated; ie not connected by semiconductor material. The formation of trenches can be done in the same step as forming the vias of the semiconductor devices.

The method can include the step of removing a part of the material of the flexible connected layer within the separation vias. Modifying the flexible connected layer by removing some of that part of the material of the flexible connected layer that is within the separation vias facilitates subsequent separation of the individual devices.

The method can include the step of separating devices by mechanically separating the devices; ie by breaking the connections between devices the action of a mechanical force. The method can include the step of separating devices by chemically separating the devices; ie by breaking the connections between devices by the action of a chemical agent.

The method can include the step of placing the separated wafer layer onto an expandable film. The flexible connected layer ensures that the wafer layer is supported during transfer of the wafer to the expandable film. The expandable film provides a substrate on which the plurality of devices are mounted during testing in a volume production facility.

The method can include the step of expanding the flexible film to separate the individual semiconductor devices. This allows the individual semiconductor devices to be separated.

Using a thin semiconductor layer can ensure that the thermal resistance of the device is low enough to ensure safe operation. The semiconductor wafer layer can have a thickness of less than substantially 125 $\mu$m. Preferably, when the wafer layer is GaAs, the wafer layer has a thickness of less than substantially 40 $\mu$m. Most preferably, the wafer layer has a thickness of less than substantially 38 $\mu$m.

The material of the wafer can be a compound semiconductor. Preferably the material of the wafer is gallium arsenide GaAs. GaAs provides devices having particularly advantageous electronic properties for high power handling applications. The material of the wafer can be indium phosphide (InP).

The wafer can have a diameter corresponding to a volume fabrication standard diameter. Preferably the wafer diameter is not less than substantially 150 mm/6 inches. More preferably, the wafer diameter is not less than substantially 100 mm/4 inches. Most preferably the wafer is a whole wafer; ie the wafer has not come from a wafer that has been broken into smaller parts.

According to a further aspect of the invention, there is provided a semiconductor device fabricated according to the first aspect of the invention.

The device can be a transistor. The transistor can be a power transistor. Preferably, the device is a pseudomorphic high electron mobility transistor (pHEMT). The pHEMT has a high efficiency and better high frequency performance leading to better linear performance compared to LDMOS transistors. The pHEMT is particularly suitable for power applications that required good high frequency performance such as wireless telecommunications applications.

An embodiment of the present invention will now be described in detail, by way of example only, and with reference-to the accompanying drawings, in which:

FIGS. 1A to H respectively show a schematic illustration of a cross section through a wafer at different steps during a device fabrication process according to the invention and including a wafer handling step according to the present invention;

FIGS. 2E and 2F show a schematic illustration of alternative processing steps for the process of the invention; and FIGS. 3E and 3F show a schematic illustration of further alternative processing steps for the process of the current invention.

Similar items in the different figures share common reference numerals, unless indicated otherwise. Depending on context, the term 'wafer' will be used to indicate either a wafer of semiconductor material itself, or the entire composite structure comprising the semiconductor material wafer layer and other structures, such as a device topography layer or carrier substrate, at different stages of processing.

With reference to FIGS. 1A to 1H, there is shown a schematic cross section through a wafer illustrating the steps of the semiconductor device manufacturing process.

Initially a 150 mm diameter wafer of GaAs semiconductor material 110 having a thickness of approximately 650 $\mu$m is prepared. A device topology 120 is defined on a front side surface of the wafer, comprising gold electrodes deposited on the wafer 110. A device topology 120 is defined per device to be fabricated by the process. As schematically shown in FIG. 1, four devices are to be fabricated, although in practice hundreds of devices will be fabricated form a single wafer. The wafer 110 and electrodes are mounted on a carrier substrate 130 made of multi-crystal sapphire, which has a similar thermal expansivity to GaAs, by a layer of heat sensitive adhesive 140.

As illustrated in FIG. 1B, the backside of semiconductor wafer layer 110 is mechanically ground to an intermediary thickness of approximately 50 $\mu$m and then the grinding damage is removed using a stress-relief chemical etch step to remove the inherent stress damage caused by the grinding step. This provides a thinned semiconductor wafer layer 112 having a thickness of less than substantially 40 $\mu$m, and close to 30 $\mu$m as illustrated in FIG. 1C.

In the next step, as illustrated in FIG. 1D, vias and trenches are created connecting the front side and back side of the wafer layer 112. The vias and trenches are formed in the same process step using a conventional dry etch technique. Alternatively, the vias and trenches can be formed in two separate steps, in which case the trenches are formed by wet etching and the vias by dry etching. Via 114, is an electrical via which is formed for each device to allow an electrical connection to be formed through the semiconductor material. Trenches 116 are also formed between, what is to become, each of the adjacent devices, 122, 124, 126, 128.

The semiconductor layer material of each of the devices is isolated by removing that part 118 of the thinned semiconductor layer 112 between the adjacent device semiconductor material parts 119. Removal of the inter-connecting semiconductor material layer parts separates the devices, but the carrier substrate 130 provides mechanical stability to the wafer in order to prevent the wafer from breaking. Further, the position of the devices is retained as they are connected to the carrier substrate 130.

In the next step, a film 150 of gold is deposited on the wafer. The film fills the vias and trenches and provides an electrical connection through the vias 114. The gold plating step, illustrated in FIG. 1E provides a flexible membrane, or layer, 150. This gold layer also re-connects the semiconductor layer parts of the individual devices as it is in the form of a continuous, connected structure, along the backside of the thinned semiconductor wafer layer 112.

The connecting layer can be made from a material having a high thermal conductivity, such as copper or silver. What is important is that it provides a path from the device topology out of the bottom of the device which has a low thermal resistance, and so helps to allow heat to be dissipated. The connecting layer material is approximately 10–20 $\mu$m thick in the regions where is overlaps the semiconductor parts of the devices.

In order to improve ultimate separation of the devices, the flexible layer is modified, as illustrated in FIG. 1F, by removing part 152 of the flexible layer material within the trenches 116 by using a chemical agent whilst ensuring that the flexible layer remains connected. A standard photolithographic masking technique is used to mask the non-trench parts of the flexible layer that are not to be removed. A potassium iodide mixture can be used as the chemical agent for removing gold. In general the chemical agent required will depend on the material of the flexible layer as will be understood by a person of skill in this art.

The wafer is then dismounted from the carrier substrate using a heated solvent and standard cleaning procedures. However, the modified connected flexible layer 154 provides a support structure which provides mechanical support to the thinned semiconductor wafer layer, thereby preventing it breaking during transfer to an expandable film 160. The entire full sized wafer can thus be removed from the carrier substrate 130 and attached to the flexible film. The flexible connected layer 154 absorbs any stresses involved in the de-mounting step or in attaching to the expandable film 160. The thinned wafer is attached to the expandable film, known as UV tape in the art, using a standard mounting procedure. The UV tape includes a UV sensitive adhesive, which is initially tacky and the tackiness of which is reduced, or de-activated, by the action of UV radiation.

Testing can then be carried out. As the positions of the devices are fixed any location dependent information can be easily obtained.

Finally, the individual devices 165 are separated by expanding the expandable film 160, as illustrated in FIG. 1H by arrows 170, 172. This provides a mechanical separating step in which expanding the film applies mechanical forces which act on and break the weak mechanical links between the devices.

The wafer handling method can use a number of alternative methods for the step of providing a flexible connected layer.

As a first alternative, the flexible connected layer can have a composite layered structure, which comprises layers of at least two different materials. As illustrated schematically in FIGS. 2E and 2F, in a first step, a first thin layer 202 of a titanium/tungsten alloy (having an approximately 10% titanium composition) is deposited over the thinned wafer layer 112. Then a second, thicker layer 204 of gold is deposited over the first layer, to form a composite connected layer 206. Then a mask is used and the gold part of the connected layer in the trenches is etched away so that only the thin layer of Ti/W alloy is left connecting the individual devices. This provides a flexible connected layer 208 having different layers of different materials. After the wafer has been dismounted, a chemical agent which attacks the Ti/W alloy connecting parts 210 rather than the gold layer 204 is used to chemically separate the individual devices.

A thin layer 202 is used as it both makes it easier to separate the devices and does not significantly reduce the thermal resistance of the path from the device topology through the via.

A further alternative method of providing the flexible connected layer will now be described with reference to FIGS. 3E and 3F. In this alternative, the connected layer 308 is provided as a composite layer having only a single layer but comprising regions of different materials. In a first step, a mask is used and a first, thin layer of Ti/W alloy 302 is deposited in the trenches only, and not over the bottom surface of the semiconductor material layer 112 nor in the vias. A second, thicker gold layer 304 is then deposited only over the semiconductor material and in the vias, again using a mask. (Alternatively, the gold layer can be deposited everywhere, and a mask used to remove the gold layer part within the trenches). In this way, a composite single connecting layer 308 is provided comprising the thicker gold layer parts 304 and the thinner Ti/W alloy parts 302 connecting the individual devices. The Ti/W alloy parts can then be chemically attacked and removed to chemically separate the individual devices as described above. Mechanical separation of the devices can also be used if the connecting parts are sufficiently frangible.

The present method can be contrasted with prior art methods in the following respects at least.

In comparison with prior art techniques for fabricating devices in which a semiconductor wafer layer is ground down to a relatively thick layer, typically 125 $\mu$m, it is the thickness of the semiconductor layer which supports the wafer during dismounting from a carrier substrate and not any connected flexible layer.

In comparison with prior art techniques in which the semiconductor wafer layer is ground to a low thickness, the individual devices are supported by the carrier substrate prior to dismounting by a "wash off" process during which the devices are separated and which is incompatible with attaching the devices to an expandable film. Solvents and cleaning agents are used to clean the separated devices, but since they are suspended in solution, they become mixed up and any location dependent information is lost. Cleaning, handling and individually testing free standing devices is extremely labour intensive, of low yield, and consequently results in a high unit cost.

The present invention, however, allows volume manufacturing techniques to be used on full sized wafers, while allowing thinned semiconductor devices to be reliably fabricated. A particular application of the method is in the fabrication of pHEMTs with a GaAs semiconductor layer thickness of approximately 30 $\mu$m which have good efficiency and linear performance at high frequencies, while obviating thermal degradation.

What is claimed is:

1. A method of handling a semiconductor wafer from which a plurality of semiconductor devices are to be fabricated during a semiconductor device fabrication process, comprising the steps of:

providing a semiconductor wafer layer mounted on a carrier substrate;

forming a trench through the semiconductor wafer layer and between adjacent devices;

attaching a flexible connected layer to the semiconductor wafer layer, at least a part of the material of the flexible connected layer being present in the trenches;

removing a part of the material of the flexible connected layer within the trenches; and separating the wafer layer from the carrier substrate while supported by the flexible connected layer.

2. A method as claimed in claim 1, and including the step of placing the separated wafer layer onto an expandable film.

3. A method as claimed in claim 2, and including the step of expanding the expandable film to separate individual semiconductor devices.

4. A method as claimed in claim 1, in which the semiconductor wafer layer has a thickness less than substantially 125:$\mu$m.

5. A method as claimed in claim 4, in which the semiconductor wafer layer has a thickness less than substantially 40:$\mu$m.

6. A method as claimed in claim 1, in which the material of the wafer is GaAs.

7. A method as claimed in claim 1, in which the wafer has a diameter corresponding to a mass production facility.

8. A method as claimed in claim 1, and including the step of mechanically separating adjacent semiconductor devices.

9. A method as claimed in claim 1, and including the step of chemically separating adjacent semiconductor devices.

10. A method as claimed in claim 1, in which the flexible connected layer is a composite layer.

11. A method as claimed in claim 10, in which the composite layer comprises layers of different materials.

12. A method as claimed in claim 10, in which the composite layer comprises a layer having parts of different materials.

13. A method as claimed in claim 12, in which the composite layer is a single layer.

* * * * *